(12) United States Patent
Kim et al.

(10) Patent No.: US 6,998,351 B2
(45) Date of Patent: Feb. 14, 2006

(54) METHOD FOR FORMING A MICRO PATTERN

(75) Inventors: Jong Hoon Kim, Sungnam-Shi (KR); Choi Dong Kim, Ichon-Shi (KR)

(73) Assignee: Hynix Semiconductor Inc., Ichon-Shi (KR)

( * ) Notice: Subject to any disclaimer, the term of this patent is extended or adjusted under 35 U.S.C. 154(b) by 89 days.

(21) Appl. No.: 10/614,182

(22) Filed: Jul. 8, 2003

(65) Prior Publication Data

US 2004/0127056 A1    Jul. 1, 2004

(30) Foreign Application Priority Data

Dec. 13, 2002    (KR) .................... 10-2002-0079606

(51) Int. Cl.
  *H01L 21/31*    (2006.01)
  *H01L 21/302*   (2006.01)
(52) U.S. Cl. .............. 438/725; 438/710; 438/758
(58) Field of Classification Search .............. 438/710, 438/758, 626, 725; 430/311, 312, 313
  See application file for complete search history.

(56) References Cited

U.S. PATENT DOCUMENTS

| 5,477,360 A | * | 12/1995 | Sunohara et al. | .......... 349/132 |
| 5,519,802 A | * | 5/1996 | Field et al. | .......... 385/129 |
| 5,596,435 A | * | 1/1997 | Sunohara et al. | .......... 349/132 |
| 5,615,041 A | * | 3/1997 | Field et al. | .......... 359/326 |
| 5,728,509 A | * | 3/1998 | Eda et al. | .......... 430/321 |
| 5,999,325 A | * | 12/1999 | Eda et al. | .......... 359/619 |
| 6,178,035 B1 | * | 1/2001 | Eda et al. | .......... 359/326 |
| 6,284,149 B1 | * | 9/2001 | Li et al. | .......... 216/64 |
| 6,358,665 B1 | * | 3/2002 | Pawlowski et al. | .......... 430/270.1 |
| 6,645,851 B1 | * | 11/2003 | Ho et al. | .......... 438/626 |
| 2005/0037291 A1 | * | 2/2005 | Nitta et al. | .......... 430/330 |

FOREIGN PATENT DOCUMENTS

| KR | 1020020017795 |   | 3/2002 |
| KR | 1020020017795 A | * | 7/2002 |

* cited by examiner

*Primary Examiner*—Alexander Ghyka
(74) *Attorney, Agent, or Firm*—Mayer, Brown, Rowe & Maw LLP

(57) ABSTRACT

Disclosed is a method for forming a micro pattern. After a dual photoresist film having different glass transition temperatures is coated, an exposure process and a wet development process are implemented to form a dual photoresist film pattern. A RFP is then implemented for the dual photoresist film pattern. Therefore, it is possible to prohibit warpage of the photoresist film pattern. Accordingly, the uniformity of the critical dimension and a pattern shape could be improved. A good uniformity of the critical dimension and a good pattern shape in the etch process could be thus implemented.

10 Claims, 2 Drawing Sheets

METHOD FOR FORMING A MICRO PATTERN

BACKGROUND OF THE INVENTION

1. Field of the Invention

The present invention relates to a method for forming a micro pattern, and more particularly, to a method of forming a micro pattern capable of improving the uniformity of the critical dimension and a pattern shape in a photolithography process and improving the uniformity of the critical dimension and a pattern shape in an etch process accordingly, by improving a pattern abnormality phenomenon occurring in a micro contact formation process using RFP (resist flow process).

2. Background of the Related Art

As the semiconductor devices are higher integrated and the design rule are narrowed, RFP (resist flow process) has been employed in order to implement a contact pattern of a high resolution of below 0.14 μm and enhance formation of the pattern. The RFP is a process used to enhance a high resolution in the exposure equipment. This process includes reducing the size of a contact pattern by heating the contact pattern that was already exposed and formed at a given temperature of over a glass transition temperature of the photoresist film for over a given time, so that flow of the photoresist film is caused. However, during the RFP, if it exceeds an adequate temperature, i.e., temperature higher than the glass transition temperature and an adequate time, the photoresist film excessively flows, so that overhang that the photoresist film pattern is warped occurs. As a result, this makes it impossible to obtain a desired contact pattern in a subsequent etch process.

SUMMARY OF THE INVENTION

Accordingly, the present invention is contrived to substantially obviate one or more problems due to limitations and disadvantages of the related art.

An object of the present invention is to provide a method for forming a micro pattern capable of improving the uniformity of the critical dimension and a pattern shape in a photolithography process and improving the uniformity of the critical dimension and a pattern shape in an etch process accordingly, by improving a pattern abnormality phenomenon occurring in a micro contact formation process using RFP (resist flow process).

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of forming a micro pattern according to the present invention is characterized in that it comprises the steps of providing a semiconductor substrate in which a lower film is formed, coating a first photoresist film on the lower film, depositing a second photoresist film having a higher glass transition temperature than the first photoresist film on the first photoresist film, implementing an exposure process and a wet development process using a photo mask to pattern the second photoresist film and the first photoresist film, thereby forming a first photoresist film pattern, implementing RFP for the first photoresist film pattern to cause flow of the first photoresist film pattern, thus forming a second photoresist film pattern having a lower critical dimension than the first photoresist film pattern, and implementing an etch process using the second photoresist film pattern as an etch mask for the lower film to pattern the lower film.

In another aspect of the present invention, it is to be understood that both the foregoing general description and the following detailed description of the present invention are exemplary and explanatory and are intended to provide further explanation of the invention as claimed.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Figure 1:
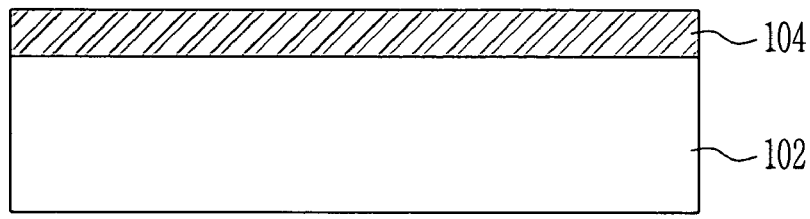
FIG. 1~FIG. 5 are cross-sectional views of semiconductor devices for explaining a method for forming a micro pattern according to a preferred embodiment of the present invention.

Reference will now be made in detail to the preferred embodiments of the present invention, examples of which are illustrated in the accompanying drawings.

FIG. 1~FIG. 5 are cross-sectional views of semiconductor devices for explaining a method for forming a micro pattern according to a preferred embodiment of the present invention. In the drawings, the same reference numerals of reference numerals in FIG. 1~FIG. 3 designate elements having the same functions.

Referring to FIG. 1, a lower film 104 is deposited on a semiconductor substrate 102. At this time, the lower film 104 may be made of all materials used in a process of fabricating semiconductor devices in the wafer manufacturing process. For example, the lower film 104 may be formed using TiN, SiON, $Si_3N_4$, organic anti-reflection film of amorphous carbon series, an inorganic anti-reflection film, or the like. In addition, the lower film 104 may be formed using all materials used as an anti-reflection film.

Figure 2:
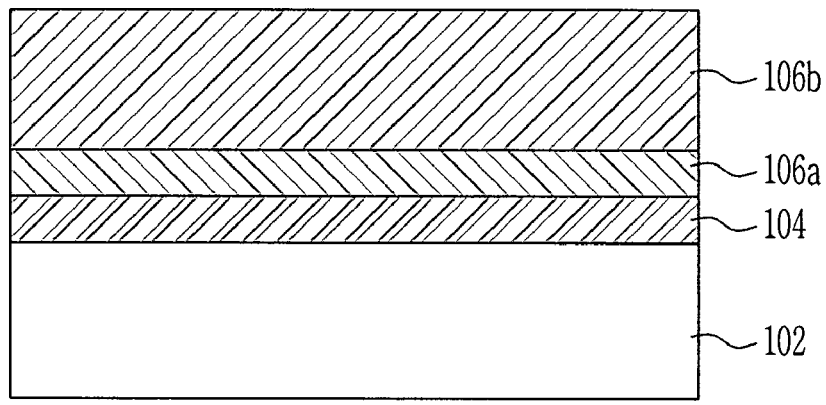

By reference to FIG. 2, first and second photoresist films 106a and 106b are sequentially coated on the entire structure. At this time, the difference in the glass transition temperature between the first photoresist film 106a and the second photoresist film 106b is made 1~10° C. In other words, a photoresist film having a glass transition temperature relatively lower than the glass transition temperature of the second photoresist film 106b is used as the first photoresist film 106a. However, the photoresist film having the same characteristics other than the glass transition temperature is employed. Furthermore, the first photoresist film 106a is formed in thickness of 0.1 μm and the second photoresist film 106b is formed in thickness of 0.5 μm.

Figure 3:
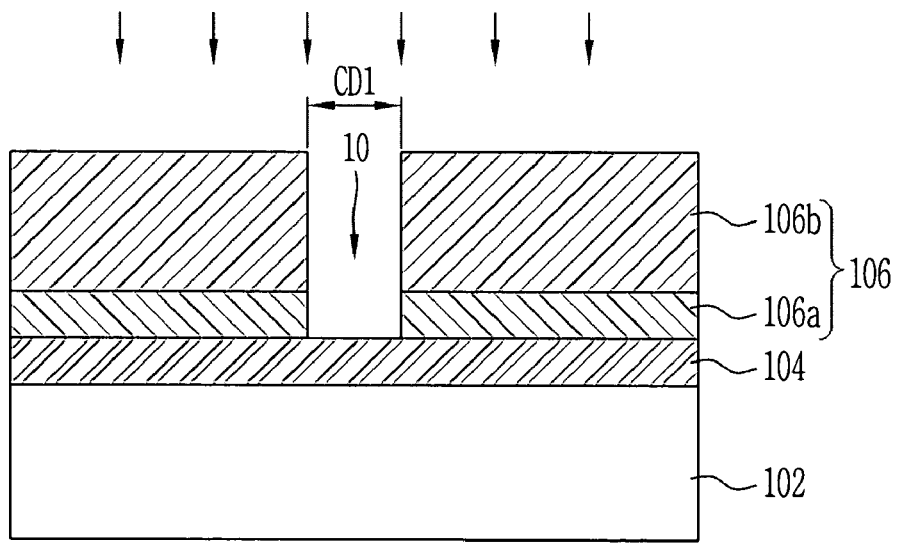

With reference to FIG. 3, a photo mask is positioned on the second photoresist film 106b. An exposure process and a wet development process are then implemented to form a photoresist film pattern 106 in which a contact hole (hereinafter called 'first contact hole') 10 has a critical dimension (CD1). At this time, the inner sidewall of the photoresist film pattern 106 is patterned to have an almost vertical profile.

Meanwhile, I-line, KrF(248 nm), ArF(193 nm), EUV (157 nm), E-beam, X-ray, and the like are used as a photoresist in the exposure process.

Figure 4:
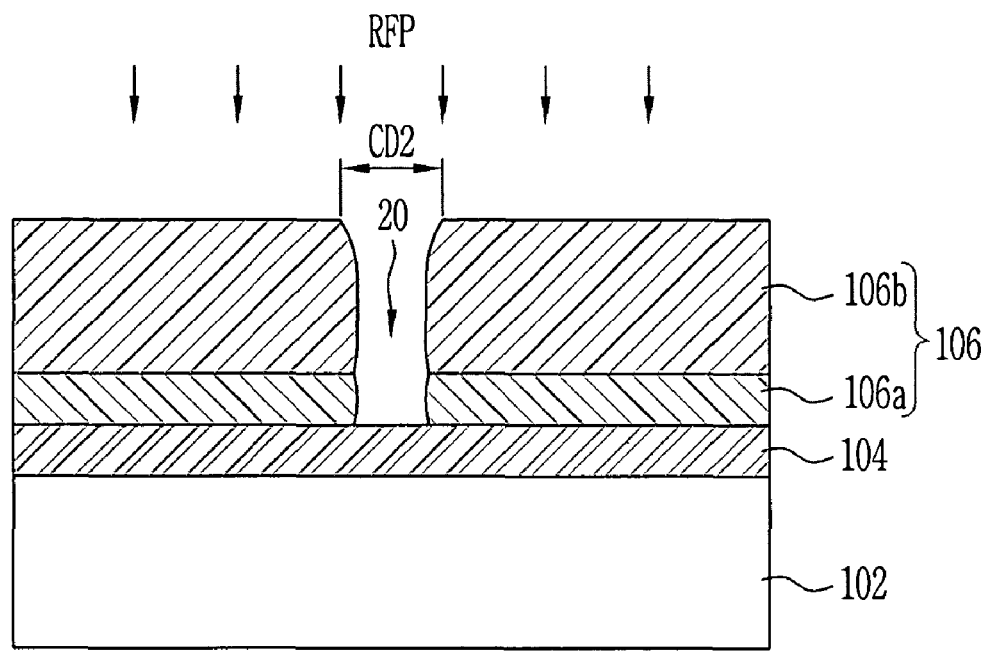

Turning to FIG. 4, RFP is implemented on the entire structure to cause flow of the first and second photoresist films 106a and 106b. The first and second photoresist films 106a and 106b are thus flowed to form a second contact hole 20 having a critical dimension (CD2). At this time, it is preferred that the heating time in the RFP is 50~200 seconds. For example, when the critical dimension (CD1) of the first contact hole 10 is 0.20 μm in FIG. 3, if the RFP is implemented at a temperature of 132° C. for 90 seconds, the second contact hole 20 having the critical dimension (CD2) of 0.13 μm could be formed without warpage. As such, the reason why a micro pattern could be implemented without warpage of the photoresist film pattern 106, i.e., the inner sidewall of the second contact hole 20 is that the RFP is implemented after photoresist films having different glass transition temperatures are stacked, as described in FIG. 2.

Figure 5:
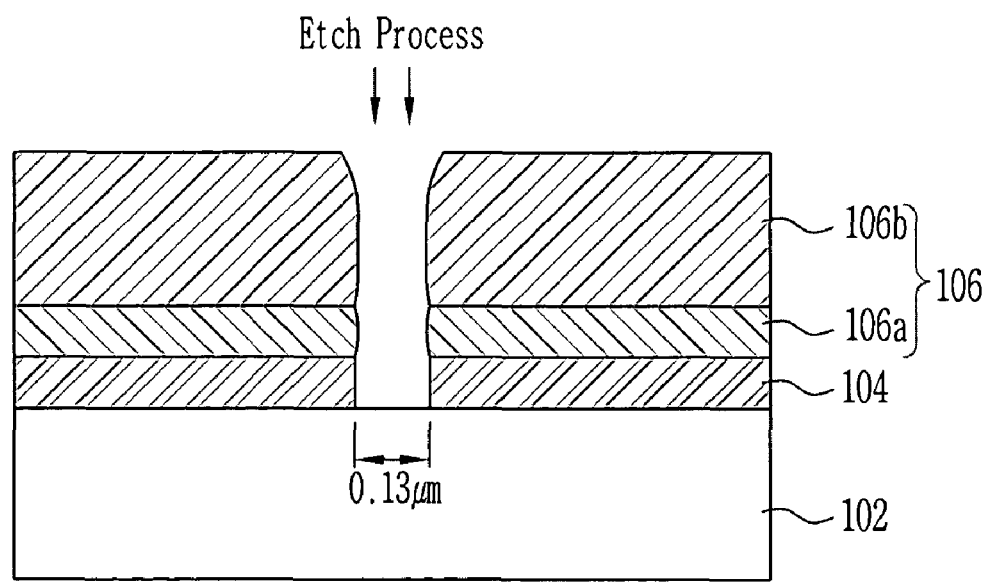

Referring to FIG. 5, an etch process using the photoresist film pattern 106 as an etch mask is implemented to pattern the lower film 104. The critical dimension of the lower film 104 becomes 0.13 μm almost same to when the critical dimension (CD2) of the second contact hole 20 is 0.13 μm in FIG. 4.

In the prior art, the RFP is implemented using a single photoresist film. In this prior art, if the exposure process and the wet development process for the single photoresist film are implemented to form a single photoresist film pattern and the RFP is then implemented, warpage occurs at the inner sidewall of the photoresist film pattern. Accordingly, if the lower film is patterned by implementing an etch process using the photoresist film pattern in which warpage occurred at its inner sidewall, it is difficult to implement a micro pattern to that extent. For instance, if a RFP is implemented when the critical dimension of a photoresist film pattern is 0.20 μm before the RFP is implemented and an etch process is then implemented using this photoresist film pattern, the critical dimension of a final lower film becomes 0.15 μm.

However, in case where the micro pattern method according to the preferred embodiment of the present invention is applied, as the RFP is implemented using a dual photoresist film having different glass transition temperatures, warpage does not occur as in the prior art. Accordingly, a micro pattern is possible compared to the prior art if an etch process using a photoresist film pattern in which warpage did not occur is implemented to pattern the lower film. For instance, if a RFP is implemented when the critical dimension of a photoresist film pattern is 0.20 μm before the RFP is implemented and an etch process is then implemented using this photoresist film pattern, the critical dimension of a final lower film becomes 0.13 μm.

As described above, according to the present invention, after a dual photoresist film having different glass transition temperatures is coated, an exposure process and a wet development process are implemented to form a dual photoresist film pattern. A RFP is then implemented for the dual photoresist film pattern. Therefore, the present invention has a new effect that it can prohibit warpage of the photoresist film pattern.

Accordingly, an etch process using the dual photoresist film pattern having no warpage is implemented to pattern the lower film. Therefore, the present invention has advantageous effects that it can improve the uniformity of the critical dimension and a pattern shape, and accordingly implement good uniformity of the critical dimension and a good pattern shape in the etch process.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method for forming a micro pattern, comprising the steps of:
    (a) providing a semiconductor substrate on which a lower film is formed using an organic anti-reflection coating of amorphous carbon series or an inorganic anti-reflection coating;
    (b) coating a first photoresist film on the lower film;
    (c) depositing a second photoresist film having a higher glass transition temperature than the first photoresist film on the first photoresist film;
    (d) patterning the second photoresist film and the first photoresist film by an exposure process and a wet development process so that first and second photoresist film pattern having a first contact hole are formed;
    (e) implementing RFP to cause the first and second photoresist film pattern to flow so that the first contact hole changes to a second contact hole having a critical dimension lower than a critical dimension of the first contact hole; and
    (f) implementing an etch process using the second photoresist film pattern as an etch mask for the lower film to pattern the lower film.

2. The method as claimed in claim 1, wherein the difference in a glass transition temperature between the first photoresist film and the second photoresist film is 1~10° C.

3. The method as claimed in claim 1, wherein the first photoresist film and the second photoresist film have the same physical properties other than the glass transition temperature.

4. The method as claimed in claim 1, wherein the first photoresist film is coated in thickness of 0.1 μm.

5. The method as claimed in claim 1, wherein the second photoresist film is coated in thickness of 0.5 μm.

6. The method as claimed in claim 1, wherein the exposure process employs I-line, KrF, ArF, EUV, E-beam or X-ray.

7. The method as claimed in claim 1, wherein during the RFP, a heating time is 50~200 seconds.

8. The method as claimed in claim 1, wherein the RFP is implemented at a temperature of 132° C. for 90 seconds.

9. The method as claimed in claim 1, wherein the critical dimension of the first photoresist film pattern is 0.20 μm.

10. The method as claimed in claim 1, wherein the critical dimension of the second photoresist film pattern is 0.13 μm.

* * * * *